(12) United States Patent
Shimmi

(10) Patent No.: US 6,385,440 B1
(45) Date of Patent: May 7, 2002

(54) MOBILE COMMUNICATION RECEIVER WITH ASYMMETRIC MUTING CONTROL

(75) Inventor: Kokoro Shimmi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/310,570

(22) Filed: May 12, 1999

(30) Foreign Application Priority Data

Jul. 29, 1998 (JP) .......................................... 10-213803

(51) Int. Cl.[7] ................................................ H04B 1/16
(52) U.S. Cl. ..................... 455/194.1; 455/212; 455/218; 455/221; 455/222
(58) Field of Search ............................. 455/194.1, 212, 455/218, 214, 221, 222, 435, 223

(56) References Cited

U.S. PATENT DOCUMENTS 4,751,725 A * 6/1988 Bonta et al. ................. 455/222
5,239,675 A * 8/1993 Dudczak ...................... 455/436
5,970,399 A * 10/1999 Rostamy et al. ............ 455/423

* cited by examiner

*Primary Examiner*—Tracy Legree
*Assistant Examiner*—Lewis West
(74) *Attorney, Agent, or Firm*—Venable; Michael A. Sartori; Jeffrey W. Gluck

(57) ABSTRACT

A mobile communication receiver generates an audio signal from a radio signal received on a communication channel, detects conditions on the communication channel, mutes the audio signal according to a first rule when the channel conditions are bad, and un-mutes the audio signal according to a second rule when the channel conditions are good. The first rule is more stringent than the second rule; as a result, sporadic muting and choppy muting are avoided.

13 Claims, 5 Drawing Sheets

MOBILE COMMUNICATION RECEIVER WITH ASYMMETRIC MUTING CONTROL

BACKGROUND OF THE INVENTION

The present invention relates to a mobile communication receiver, and is applicable to, for example, portable telephone terminals used in the North American Advanced Mobile Phone Service (hereinafter, AMPS).

AMPS is one example of a mobile communication system in which, when channel conditions between a mobile station (such as a portable telephone set) and its communicating base station (also referred to as a land station) deteriorate, output of the voice signal received by the mobile station is muted.

In the AMPS system, the forward communication channel from a base station to a mobile station occupies a thirty-kilohertz (30-kHz) frequency band. For identification purposes, the base station transmits a supervisory audio tone or SAT at an offset of 5.97 kHz, 6.0 kHz, or 6.03 kHz from the center frequency of the channel. The mobile station is informed of the offset on a separate control channel, and attempts to detect the SAT are regular intervals of, for example, two hundred milliseconds or two hundred fifty milliseconds (200 ms or 250 ms).

A conventional mobile station reproduces the voice signal received from the base station only when the SAT is detected. When the SAT is not detected, the received voice signal is muted until the SAT is detected again, at which time the received voice signal is un-muted. If the SAT is not detected at all for a predetermined period, such as five seconds (5 s), use of the channel is discontinued.

This conventional muting control scheme prevents the user from being distracted by interference and noise when channel conditions deteriorate, and succeeds in maintaining a tolerable level of voice communication quality. In general, the human sense of hearing finds occasional muting easier to tolerate than obtrusive interference or noise.

There are cases, however, in which conventional muting control has a noticeably adverse effect on communication quality. One example is brief fading of the received electric field strength on the channel from the base station to the mobile station, causing the received voice signal to be muted for a single short interval. The resulting unexpected break in an otherwise normal received voice signal is conspicuous and disturbing. Another example is the repeated muting and un-muting that occurs when the received electric field strength hovers around the SAT detection threshold, causing the user to hear a choppy voice signal that is unnatural, hard to understand, and again disturbing.

These problems could be eliminated by dispensing with muting control and using the SAT only to decide when to abandon the channel entirely. Then, however, the user might be even more disturbed by interference and noise occurring during periods of poor channel conditions that are not quite bad enough to force abandonment of the channel.

SUMMARY OF THE INVENTION

It is accordingly an object of the present invention to perform muting control in a natural and non-disturbing way in a mobile communication receiver.

The invention provides a method of controlling audio output in a mobile communication receiver that generates an audio signal from a radio signal received on a communication channel. The invented method comprises the following steps:

detecting conditions of the communication channel at predetermined intervals;

muting the audio signal according to a first rule based on the detected channel conditions; and un-muting the audio signal according to a second rule based on the detected channel conditions, the second rule being less stringent than the first rule.

The invention also provides a mobile communication receiver with a detector for detecting the channel conditions, and a control unit that, by enforcing the first and second rules, makes the transition from muting to un-muting easier than the transition from un-muting to muting.

The asymmetric muting control rule, in which the requirement for muting is more stringent than the requirement for un-muting, prevents sporadic muting and choppy muting, and leads to natural muting control of the audio signal, without disturbing effects.

DETAILED DESCRIPTION OF THE INVENTION

Figure 1:
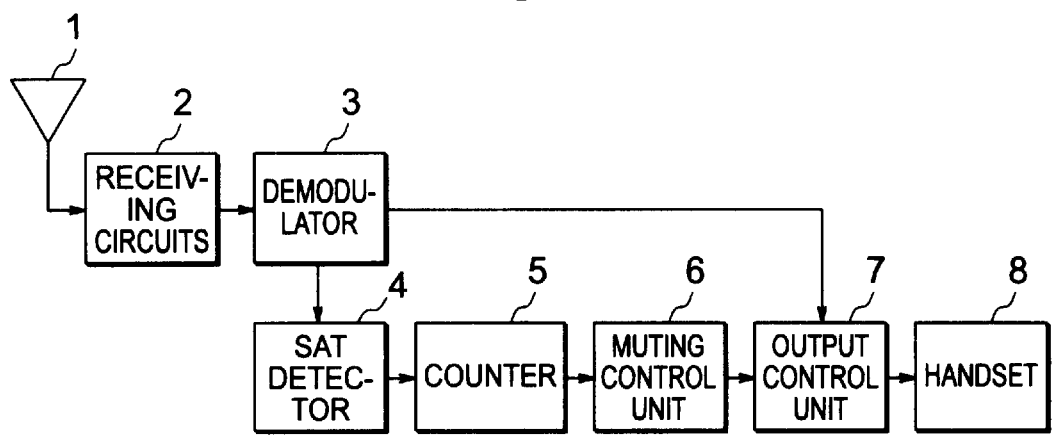
FIG. 1 is a functional block diagram of a mobile communication receiver illustrating both a first embodiment and a second embodiment of the invention.

Two embodiments of the invention will now be described with reference to the attached drawings, in which like parts are indicated by like reference characters. Both embodiments are mobile communication receivers suitable for use in AMPS portable telephone sets.

The first embodiment has the structure shown in FIG. 1, comprising an antenna 1, receiving circuits 2, a demodulator 3, a SAT detector 4, a counter 5, a muting control unit 6, an output control unit 7, and a handset 8. The second embodiment has the same structure, but differs in the operation of the counter 5 and muting control unit 6.

The antenna 1 receives a radio-frequency signal transmitted from a base station (not visible). The received signal is supplied through a duplexer (not visible) to the receiving circuits 2, which down-convert the signal to an intermediate frequency. The demodulator 3 then demodulates the intermediate-frequency signal to the baseband, and supplies the baseband signal, which is an audio-frequency signal, to the SAT detector 4 and output control unit 7.

Before voice communication begins, the frequency of the forward traffic channel from the base station to the mobile station is specified on a separate control channel, enabling the receiving circuits 2 to tune to this frequency. Alternatively, the tuning can be carried out by the demodulator 3. In addition to tuning control, automatic gain control (AGC) is also performed by the receiving circuits 2 or demodulator 3.

Figure 2:
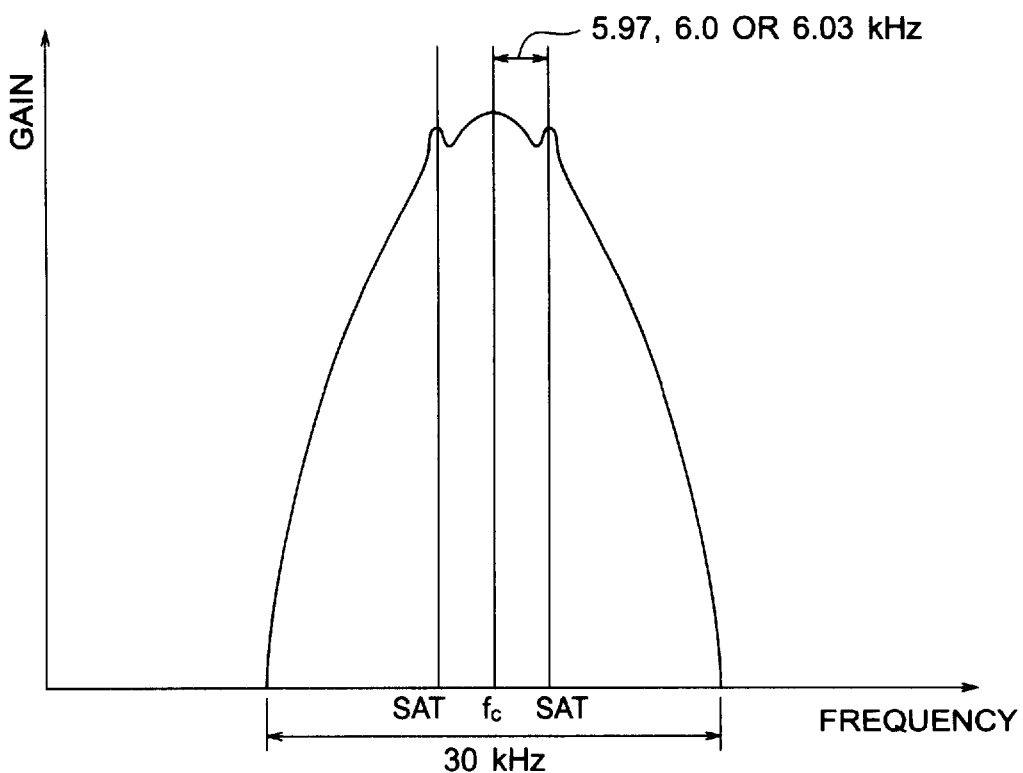
FIG. 2 is a graph illustrating the frequency spectrum of a traffic channel.

FIG. 2 schematically shows the frequency spectrum of a traffic channel, indicating frequency on the horizontal axis and power level or gain on the vertical axis. The SAT is transmitted at one or both of the indicated frequencies on either side of the center frequency $f_c$. After demodulation, the SAT appears in the baseband signal as a pure tone with a frequency of 5.97 kHz, 6.0 kHz, or 6.03 kHz.

At predetermined intervals (for example, once every 250 ms, or once every 200 ms), the SAT detector 4 attempts to detect the SAT in the baseband signal. Specifically, the SAT detector 4 determines whether the SAT is strong enough to be separated from the voice signal. For example, the SAT detector 4 compares the difference between the signal level at the SAT frequency and the signal level at the frequency corresponding to $f_c$ in FIG. 2 with a predetermined threshold, and reports detection or non-detection of the SAT according to the result of the comparison. Alternatively, the SAT detector 4 compares the ratio of the two signal levels with a threshold, or takes the difference or ratio between the SAT level and a power level a predetermined number of decibels lower than the $f_c$ signal level. Detection of the SAT indicates good channel conditions between the base station and mobile station, while non-detection of the SAT indicates bad channel conditions.

The counter 5 counts intervals in which the SAT is not detected, and stops counting when a predetermined limit value is reached.

The muting control unit 6 generates mute and un-mute commands according to the count output by the counter 5. Specifically, the muting control unit 6 generates a mute command when the count is equal to the limit value, and generates an un-mute command when the count is less than the limit value. The generated command is supplied to the output control unit 7.

When the output control unit 7 receives an un-mute command from the muting control unit 6, it passes the baseband signal to the handset 8, through a filter that removes the SAT frequency component. When the output control unit 7 receives a mute command from the muting control unit 6, it blocks the baseband signal and supplies a mute signal to the handset 8. The mute signal may be a completely silent signal, or a low-level comfort-noise signal, for example.

The handset 8 has a loudspeaker through which the baseband signal or mute signal received from the output control unit 7 is reproduced as an audio signal.

The mobile communication receiver also has a timer, not shown in FIG. 1, that determines the intervals at which the SAT detector 4 attempts to detect the SAT. The counter 5, muting control unit 6, and output control unit 7 also operate at the intervals determined by the timer.

Next, the operation of the SAT detector 4, counter 5, and muting control unit 6 in the first embodiment will be described in more detail.

In the first embodiment, the counter 5 outputs a count that is incremented by one each time the SAT detector 4 reports non-detection of the SAT, and is cleared to zero each time the SAT detector 4 reports detection of the SAT. When the count reaches the limit value, the counter 5 holds the limit value until the count is cleared by a detection signal from the SAT detector 4. The counter 5 thus counts consecutive SAT non-detection intervals, halting at the limit value and restarting from zero whenever the SAT is detected.

Figure 3:
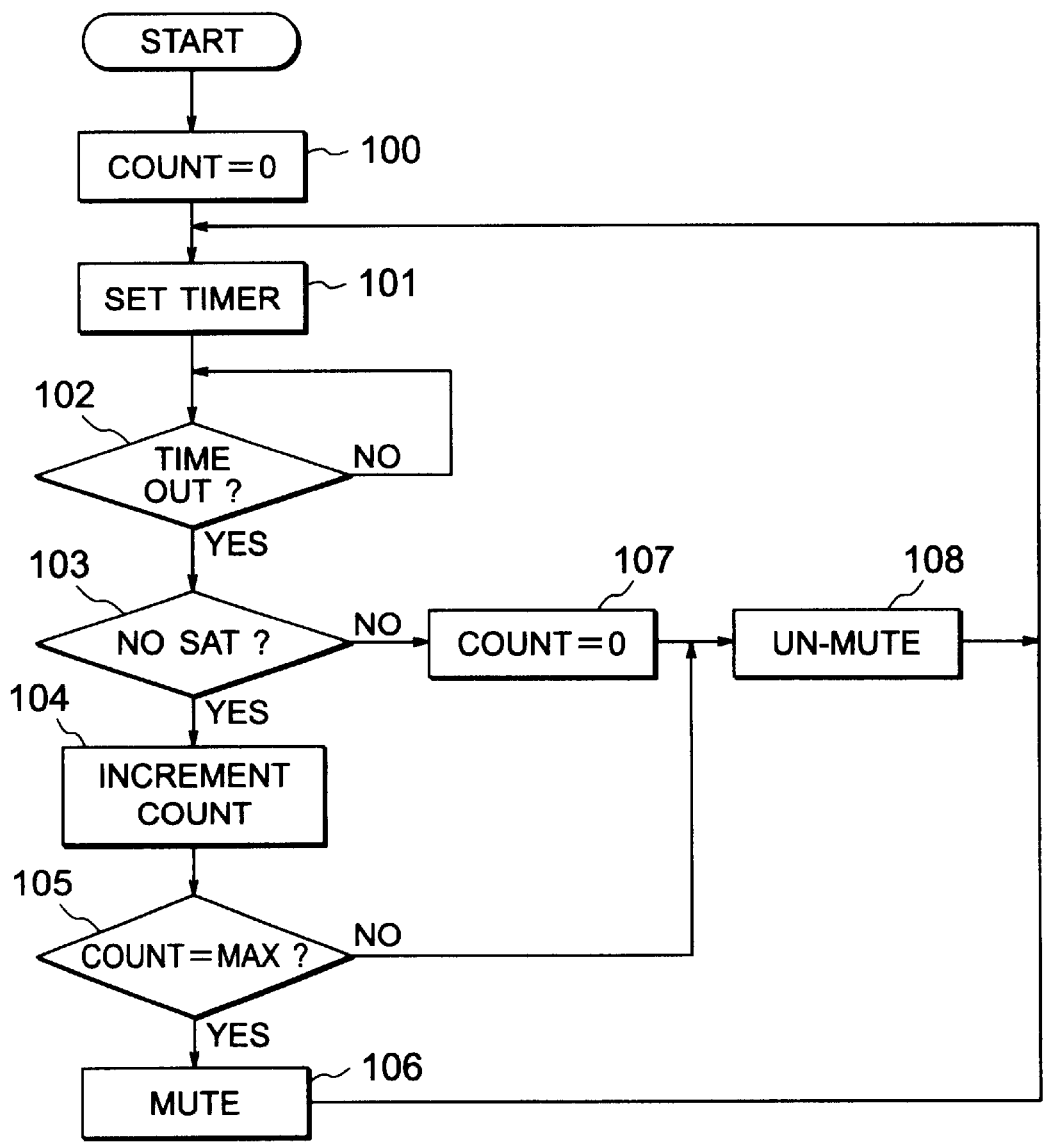
FIG. 3 is a flowchart illustrating the operation of the first embodiment.

Referring to the flowchart in FIG. 3, when the mobile station originates or receives a call and is assigned a traffic channel, the counter 5 is cleared to zero (step 100). The following steps 101 to 108 are then performed repeatedly in a loop, at intervals controlled by the above-mentioned timer (e.g. once every 250 ms or 200 ms).

At the beginning of the loop, the timer is set and started (step 101), and the SAT detector 4 waits for the timer to time out (step 102). When the timer times out, the SAT detector 4 attempts to detect the SAT (step 103). If the SAT is not detected, the counter 5 is incremented (step 104) and the resulting count is compared with the limit value, which is denoted MAX in the drawing (step 105). If the count is equal to the limit value MAX, the muting control unit 6 generates a mute command (step 106), after which the loop is repeated again from step 101. In step 104, the count is not incremented if the count is already equal to the limit value MAX.

If the SAT detector 4 detects the SAT in step 103, the counter 5 is cleared to zero (step 107), and the muting control unit 6 generates an un-mute command (step 108). The muting control unit 6 also generates an un-mute command in step 108 if the count is not equal to the limit value MAX in step 105. After step 108, the loop is repeated from step 101.

Tests performed by the inventor indicate that a mute command should be generated when the SAT is not detected for a period of about one second. An appropriate limit value (MAX) is therefore four if the timer interval is 250 ms, or five if the timer interval is 200 ms.

Figure 4:
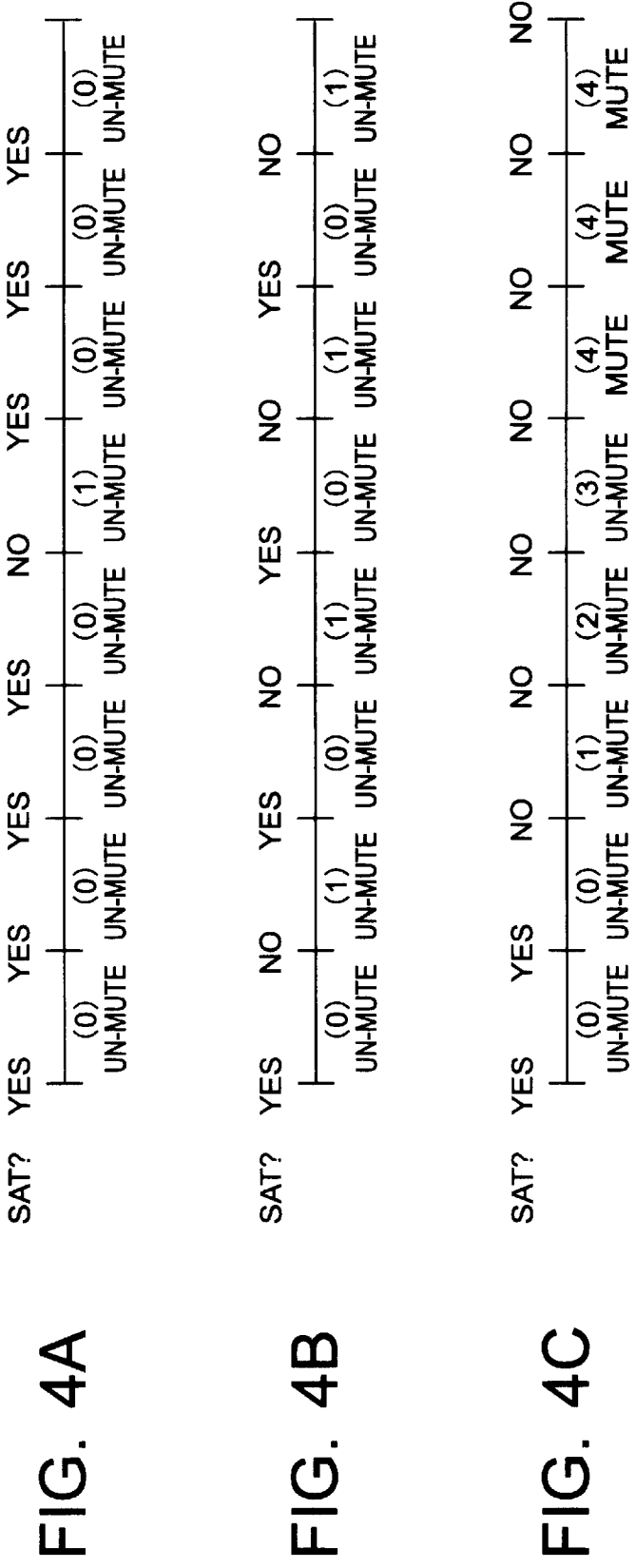
FIGS. 4A, 4B, and 4C are timeline diagrams further illustrating the operation of the first embodiment.

FIGS. 4A, 4B, and 4C show examples of the operation of the first embodiment when the limit value is four. In these drawings, 'yes' indicates SAT detection, and 'no' indicates non-detection. The numbers in parentheses are the count values.

FIG. 4A illustrates operation under good channel conditions, in which the received electric field is strong and the SAT is almost always detected. Each time the SAT is detected, the count is cleared to zero (step 107), and the muting control unit 6 generates an un-mute signal (step 108). At one point, due to a momentary fade or glitch, the SAT is not detected, and the count is incremented from zero to one. This is less than the limit value (four), so the muting control unit 6 still generates an un-mute command. The user hears a natural voice signal, uninterrupted by the moment of silence that would have occurred with conventional muting control.

FIG. 4B illustrates operation under marginal channel conditions in which the SAT is alternately detected and not detected. When the SAT is detected, steps 101, 102, 103, 107, and 108 are carried out, clearing the count to zero and producing an un-mute command. When the SAT is not detected, steps 101, 102, 103, 104, 105, and 108 are carried out, incrementing the count from zero to one and again producing an un-mute command. Since the count never reaches the limit value, the user hears a continuous voice signal. The voice signal may be slightly contaminated by noise or interference, but this is preferable to the chopped voice signal, equally contaminated by noise or interference and rendered difficult to understand by alternate muting and un-muting, that would have been produced by conventional muting control.

FIG. 4C illustrates operation under deteriorating channel conditions, when the SAT becomes completely undetectable for a period exceeding one second. Following the first two intervals, in which the SAT is detected and the count is cleared to zero, the SAT disappears. In the next three intervals, steps 101, 102, 103, 104, 105, and 108 are carried out three times, incrementing the count from zero to one, two, and then three, while the muting control unit 6 continues to generate un-mute commands. In the next interval, the count is incremented to the limit value of four, and the muting control unit 6 generates a mute command. In the next two intervals, as the SAT is still not detected, the count is held at four and the muting control unit 6 generates two more mute commands.

In this last case, the user may hear a little interference or noise, lasting about one second, before the received signal is muted. Noise followed by muting is, however, an understandable sequence of events, and may actually cause the user less annoyance than would conventional immediate muting. Moreover, channel conditions usually deteriorate slowly, so the interference or noise heard during the one-second delay tends to be comparatively weak. The inventor has confirmed in outdoor tests that a one-second delay in muting control does not produce objectionable effects, but that the delay should not be longer than about one second.

By allowing an interval of one second in which to decide whether channel conditions are bad enough to warrant muting, the first embodiment avoids the sporadic muting and choppy muting that occur with conventional muting control, and restricts muting to channel conditions under which muting is really necessary. Under these conditions, the first embodiment delays the start of muting, but causes muting to begin quickly enough to keep the user from hearing objectionable interference or noise.

Next, the operation of the SAT detector 4, counter 5, and muting control unit 6 in the second embodiment will be described. In this embodiment, the counter 5 maintains two separate SAT non-detection counts, each having a different limit value. The limit value (MAX2) of the second count (COUNT2) is less than the limit value (MAX1) of the first count (COUNT1). Each count proceeds only as high as its limit value.

Figure 5:
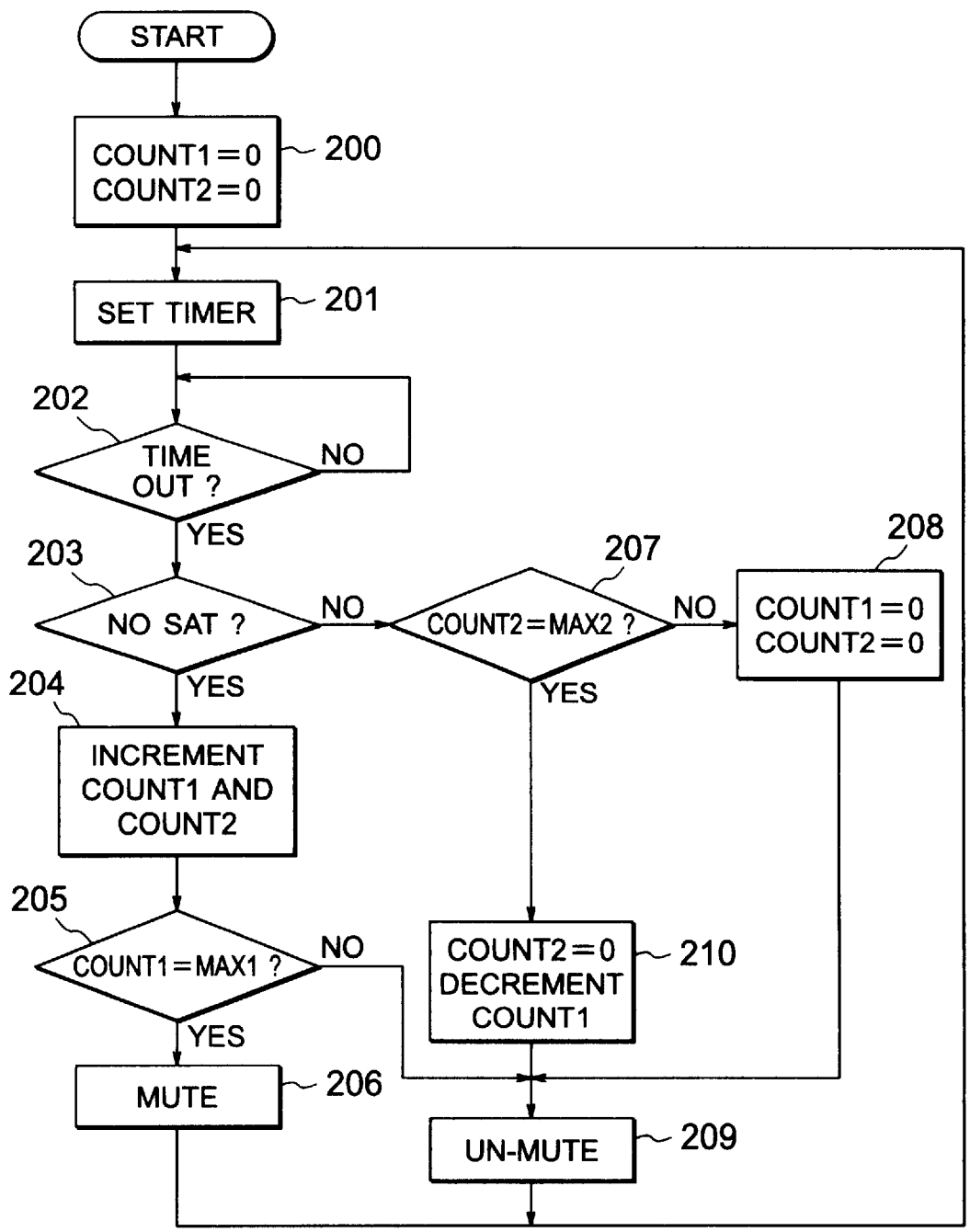
FIG. 5 is a flowchart illustrating the operation of the second embodiment.

Referring to FIG. 5, when the mobile station originates or answers a call and a traffic channel is assigned, both counts are cleared to zero (step 200). The following steps (201 to 210) form a loop that is repeated at intervals determined by the above-mentioned timer.

In the loop, first the timer is set and started (step 201). The SAT detector 4 waits for the timer to time out (step 202), then attempts to detect the SAT (step 203). If the SAT is not detected, both counts are incremented (step 204), and the first count is compared with its limit value MAX1 (step 205). If the first count is equal to its limit value, the muting control unit 6 generates a mute command (step 206).

If the SAT is detected in step 203, the second count is compared with its limit value MAX2 by the muting control unit 6 (step 207). If the second count is less than its limit value, the muting control unit 6 clears both counts (COUNT1 and COUNT2) to zero (step 208), then generates an un-mute command (step 209). If the second count is equal to its limit value, the muting control unit 6 decrements the first count (COUNT1) by one and clears the second count (COUNT2) to zero (step 210), then generates an un-mute command (step 209). An un-mute command is also generated in step 209 if the first count is less than its limit value MAX1 in step 205.

After a command has been generated in step 206 or step 209, the loop is repeated again from step 201.

Figures 6A, 6B:
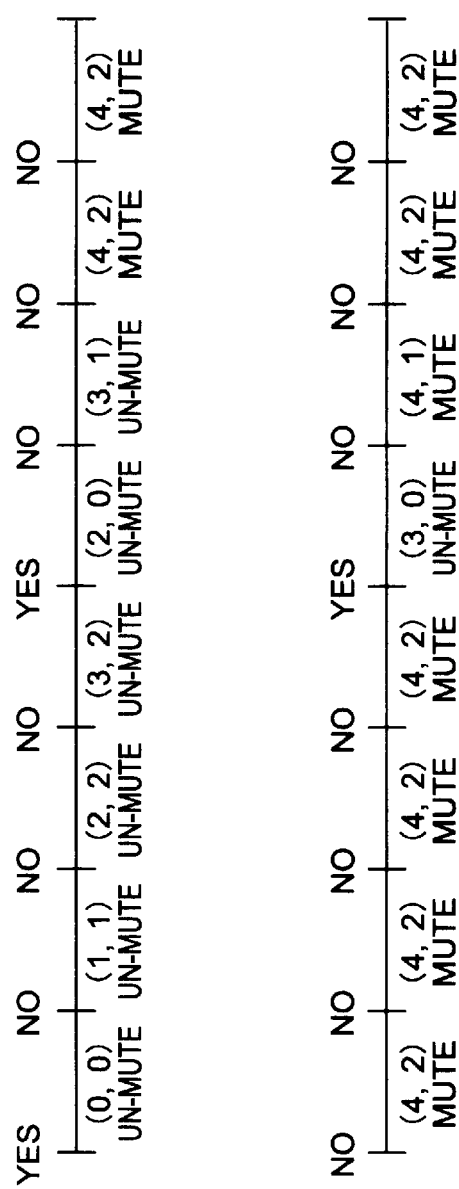
FIGS. 6A and 6B are timeline diagrams further illustrating the operation of the second embodiment.

FIGS. 6A and 6B illustrate two cases of the operation of the second embodiment, assuming that the first limit value MAX1 is equal to four and the second limit value MAX2 is equal to two. The numbers in parentheses indicate the first and second count values (COUNT1, COUNT2).

FIG. 6A illustrates a case in which channel conditions are deteriorating, but not in a perfectly regular manner. Initially, both counts in the counter 5 are less than two. SAT detection in the first interval causes steps 201, 202, 203, 207, 208, and 209 to be carried out, clearing both counts to zero and generating an un-mute command. Non-detection of the SAT in the next three intervals increments the first count to one, then two, then three, executing steps 201, 202, 203, 204, 205, and 209 and generating three more un-mute commands. The second count is also incremented, but stops at its limit value of two.

At this point, the SAT is detected again. Since the second count is equal to its limit value of two, steps 201, 202, 203, 207, 210, and 209 are carried out, clearing the second count, decrementing the first count from three to two, and generating another un-mute command. Non-detection of the SAT in the next two intervals increments the first count from two to three, then to four, at which point a mute command is generated, while the second count is incremented from zero to two. In the last interval, the SAT is not detected, both counts remain at their limit values, and another mute command is generated.

By decrementing the first count from three to two, the SAT detection in the fifth interval in FIG. 6A delays the onset of muting by two intervals, or half a second. In the first embodiment, this SAT detection would have reset the count to zero, delaying the onset of muting by four intervals, or a full second. Thus in the second embodiment, sporadic SAT detection has less delaying effect on the start of muting control than in the first embodiment.

FIG. 6B illustrates a case in which the SAT is detected once sporadically while muting is already in progress. Initially, both counts in the counter 5 are at their limit values (four, two). This state persists during the first four intervals, during which the SAT is not detected and mute commands are generated. In the fifth interval, the SAT is detected, causing steps 201, 202, 203, 207, 210, and 209 to be carried out. The second count is cleared to zero, the first count is decremented from four to three, and an un-mute command is generated. In the next interval, the SAT is not detected, so the first count is incremented to four, the second count is incremented to one, and a mute command is generated. Non-detection of the SAT continues in the next two intervals, resulting in further mute commands, while the first count remains at four and the second count is incremented to its limit value (two).

By decrementing the first count from its limit value (four) to one less than this value (three), the SAT detection in the fifth interval in FIG. 6B produces only one un-mute command. In the first embodiment, the count would have been cleared to zero, forcing at least four un-mute commands to be issued before the count could return to the limit value. Sporadic SAT detection thus causes less interruption of muting control in the second embodiment than in the first embodiment.

Incidentally, if the SAT were to be detected again in the seventh interval in FIGS. 6A and 6B, then since the second count is only equal to one, both counts would be cleared to zero. At least four non-muted intervals would then ensue, preventing the choppy alternation of muted and non-muted intervals.

The second embodiment thus provides the same advantages as the first embodiment in avoiding sporadic muting and choppy muting, and also reduces the effect of sporadic SAT detection on muting control.

The preceding embodiments illustrate just two of a large number of asymmetric control rules that can be used in practicing the present invention. To mention one of numerous possible variations, the condition for the transition from muting to non-muting can be changed from SAT detection in one interval to SAT detection in N consecutive intervals, where N is a fixed positive integer. N must be less than the limit value MAX or MAX1, to make the transition from muting to non-muting easier than the transition from non-muting to muting.

To mention another possible variation, the condition for the transition from non-muting to muting can be changed to a condition such as SAT non-detection in four out of five consecutive intervals, or five out of seven consecutive intervals. More generally, the condition can be non-detection in M out of N consecutive intervals, where M and N are positive integers with M less than N. M must be greater than the number of consecutive intervals required for the transition from muting to non-muting.

Many other transition rules can be used, provided only that the rule for the transition from non-muting to muting is more stringent than the rule for the transition from muting to non-muting. These rules do not have to be based on SAT detection; they can be based on any method of detecting good and bad channel conditions.

The invention can be practiced in any type of terminal or station in a mobile communication system, including a base station communicating with a mobile station, and a mobile station communicating with another mobile station.

Some of the functional blocks in FIG. 1 can be combined. For example, the counter 5 and muting control unit 6 can be combined into a single control unit. This control unit may be either a software or a hardware unit.

Those skilled in the art will recognize that further modifications are possible within the scope claimed below.

What is claimed is:

1. A method of controlling audio output in a mobile communication receiver that generates an audio signal from a radio signal received on a communication channel, comprising the steps of:

detecting channel conditions of the communication channel at predetermined timer intervals, thereby identifying good channel conditions and bad channel conditions;

muting said audio signal according to a first rule based on said channel conditions; and un-muting said audio signal according to a second rule based on said channel conditions, said second rule being less stringent than said first rule.

2. The method of claim 1, wherein said step of detecting comprises detecting a supervisory audio tone.

3. The method of claim 1, further comprising the step of keeping a first count of timer intervals in which said bad channel conditions are identified, said first rule muting said audio signal when said first count reaches a first limit value.

4. The method of claim 3, further comprising the step of clearing said first count whenever said good channel conditions are identified, said second rule un-muting said audio signal whenever said first count is less than said first limit value.

5. The method of claim 3, further comprising the step of clearing said first count whenever said good channel conditions are identified in a predetermined number of consecutive timer intervals, said second rule un-muting said audio signal whenever said first count is less than said first limit value.

6. The method of claim 3, further comprising the steps of:

halting said first count at said first limit value;

keeping a second count of the timer intervals in which said bad channel conditions are identified, said second count halting at a second limit value less than said first limit value;

clearing said first count and said second count if said good channel conditions are identified when said second count is less than said second limit value; and clearing said second count and decrementing said first count if said good channel conditions are identified when said second count is equal to said second limit value; wherein said second rule un-mutes said audio signal whenever said first count is less than said limit value.

7. The method of claim 1, wherein:

said first rule mutes said audio signal if said bad channel conditions are identified in at least a predetermined first number of timer intervals among a predetermined second number of consecutive timer intervals; and said second rule un-mutes said audio signal if said good channel conditions are identified in a predetermined third number of consecutive timer intervals, said third number being greater than zero and less than said first number.

8. A mobile communication receiver that generates an audio signal from radio signal received on a communication channel, comprising:

a detector detecting channel conditions of the communication channel at predetermined timer intervals, thereby identifying good channel conditions and bad channel conditions; and a control unit coupled to said detector, muting and un-muting said audio signal according to said channel conditions, following a rule that makes a transition from muting to un-muting easier than a transition from un-muting to muting.

9. The mobile communication receiver of claim 8, wherein said detector detects a supervisory audio tone.

10. The mobile communication receiver of claim 8, wherein said control unit mutes said audio signal if said detector identifies said bad channel conditions in a predetermined first number of consecutive timer intervals, and un-mutes said audio signal if said detector identifies said good channel conditions in a predetermined second number of consecutive timer intervals, said second number being greater than zero but less than said first number.

11. The mobile communication receiver of claim 10, wherein said second number is one.

12. The mobile communication receiver of claim 8, wherein said control unit keeps a first count of the timer intervals in which said bad channel conditions are identified, keeps a second count of the timer intervals in which said bad channel conditions are identified, halts said first count at a first limit value, halts said second count at a second limit value less than said first limit value, clears said first count and said second count if said good channel conditions are identified when said second count is less than said second limit value, clears said second count and decrements said first count if said good channel conditions are identified when said second count is equal to said second limit value, mutes said audio signal when said first count reaches said first limit value, and un-mutes said audio signal when said first count is less than said first limit value.

13. The mobile communication receiver of claim 8, wherein said control unit mutes said audio signal if said detector identifies said bad channel conditions in at least a predetermined first number of timer intervals among a predetermined second number of consecutive timer intervals, and un-mutes said audio signal if said detector identifies said good channel conditions in a predetermined third number of consecutive timer intervals, said third number being greater than zero and less than said first number.

* * * * *